(12) United States Patent
Park et al.

(10) Patent No.: US 7,176,552 B2
(45) Date of Patent: Feb. 13, 2007

(54) SEMICONDUCTOR MEMORY DEVICE HAVING A DECOUPLING CAPACITOR

(75) Inventors: Je-Min Park, Suwon-si (KR); Yoo-Sang Hwang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/154,922

(22) Filed: Jun. 16, 2005

(65) Prior Publication Data

US 2006/0113633 A1    Jun. 1, 2006

(30) Foreign Application Priority Data

Nov. 30, 2004   (KR) ...................... 10-2004-0099051

(51) Int. Cl.
*H01L 29/00* (2006.01)
(52) U.S. Cl. ............................... 257/534; 257/E27.088
(58) Field of Classification Search ................ 257/534, 257/E27.088
See application file for complete search history.

(56) References Cited

U.S. PATENT DOCUMENTS 6,888,716 B2 *   5/2005   List et al. ................ 361/306.2

2001/0014040 A1 *   8/2001   Ooishi ........................ 365/200

FOREIGN PATENT DOCUMENTS

| JP | 09-283718 | 10/1997 |
|---|---|---|
| JP | 2000-150824 | 5/2000 |
| JP | 2000-252437 | 9/2000 |
| KR | 10-2004-0059437 | 7/2004 |

OTHER PUBLICATIONS

Patent Abstracts of Japan for Publication No. 09-283718.
Patent Abstracts of Japan for Publication No. 2000-150824.
Patent Abstracts of Japan for Publication No. 2000-252437.
Korean Intellectual Property Office Korean Patent Abstracts for Publication No. 10-2004-0059437.

* cited by examiner

*Primary Examiner*—N. Drew Richards
*Assistant Examiner*—Mohammad Timor Karimy
(74) *Attorney, Agent, or Firm*—F.Chau & Associates, LLC

(57) ABSTRACT

A semiconductor memory device comprises a cell capacitor having a first buried contact connected with a semiconductor substrate of a cell region and a first storage node connected with the first buried contact, and a decoupling capacitor for reducing a coupling noise, having a plurality of second buried contacts formed on a semiconductor substrate portion adjacent in the cell region and extended in parallel with each other and a plurality of second storage nodes connected with the second buried contacts.

15 Claims, 7 Drawing Sheets

SEMICONDUCTOR MEMORY DEVICE HAVING A DECOUPLING CAPACITOR

CROSS-REFERENCE TO RELATED APPLICATION

This application claims priority to Korean Patent Application No. 10-2004-0099051, filed on Nov. 30, 2004, the disclosure of which is incorporated herein in its entirety by reference.

TECHNICAL FIELD

The present disclosure relates to a semiconductor memory device, and more particularly, to a semiconductor memory device having a decoupling capacitor.

BACKGROUND

Semiconductor memory devices, e.g., dynamic random access memories (DRAMs), require high speed as well as high integration. A logic part such as a central processing unit (CPU) of semiconductor products becomes fast in its speed to process more data for a short time. Accordingly, an increase in speed as well as in a storage capacity of the semiconductor memory devices such as DRAMs becomes important.

A speed increase of the semiconductor memory devices can be generally realized using a metal wiring having low resistance. For example, a copper wiring is used to lower wiring resistance instead of a conventional aluminum wiring. An effort to reduce a delay due to a coupling noise also has been made. The coupling noise generally occurs due to the parasitic capacitance of a parasitic capacitor. Thus, the parasitic capacitance should be decreased to reduce the RC delay. To reduce the parasitic capacitance, an insulation film of low dielectric constant can be formed on a wiring portion, or decoupling capacitors for canceling out the parasitic capacitance can be formed around a cell region.

The decoupling capacitors have been formed using a gate-oxide film. However, as integration of the semiconductor devices increases, a capacity of the decoupling capacitors should be increased. Thus, it has been difficult to realize a high capacitance using a plate-type dielectric film such as the gate-oxide film.

A decoupling capacitor having a high capacity using a structure such as a cell capacitor has been studied. However, the structure of the cell capacitor was not easy to manufacture. A decoupling capacitor using a cell capacitor becomes available with a development of a square-type storage node of a capacitor-over-bit-line (COB) type, in which a capacitor is formed on a bit line. A decoupling capacitor of semiconductor memory devices according to a conventional art will be described below with reference to accompanying drawings.

FIG. 1 is a cross-sectional view illustrating a conventional semiconductor memory device. Referring to FIG. 1, the semiconductor memory devices 100 can be divided into a cell region A, where a cell capacitor is formed, and a decoupling capacitor region B. The cell capacitor includes storage nodes 135a, and a decoupling capacitor includes storage nodes 135b. These two different storage nodes 135a and 135b are formed on the respective buffer layers 131a and 131b. The buffer layers 131a and 131b connect the storage nodes 135a and 135b with the respective buried contacts 130a and 130b.

Thus, as illustrated in FIG. 1, although disalignment is generated between the buried contacts 130a and 130b and the storage nodes 135a and 135b, the buffer layers 131a and 131b can properly connect the buried contacts 130a and 130b with the storage nodes 135a and 135b, respectively. The storage nodes 135a and 135b are formed within mold oxide films 132a and 132b, and the buried contacts 130a are formed within an inter-layer insulation film 127.

The buried contacts 130a of the cell region A is connected with a semiconductor substrate 105, more specifically, with a source/drain portion (not shown) confined by a device isolating region 110 through cell pads 125. The cell pads 125 are formed in a self-alignment structure created by word-line gates 120a and their lateral spacers 122. The word-line gates 120a include insulation films 115a, gate electrode films 117a, and capping films 119a.

The buried contacts 130b of the decoupling capacitor region B are formed on a capping film 119b. A gate insulation film 115b, a gate electrode film 117b, and the capping film 119b are sequentially formed on the semiconductor substrate 105.

FIG. 2 is a plan view illustrating a decoupling capacitor of the semiconductor memory device according to the conventional technology of FIG. 1. As illustrated in FIG. 2, a decoupling capacitor 100B includes a plurality of storage nodes 135b formed on a buffer layer 131b. A plurality of plate electrodes 150b are formed on the storage nodes 135b.

As integration of the memory device increases, a structure without the buffer layer 131a of the cell region A becomes available. Thus, in the decoupling capacitor region (region B of FIG. 1), a structure connecting the decoupling capacitor 100B with the buried contact 130b without the buffer layer 131b is in study.

SUMMARY OF THE INVENTION

In general, exemplary embodiments of the invention include highly-integrated semiconductor memory devices capable of reducing a decoupling noise.

In an exemplary embodiment of the present invention, a semiconductor memory device comprises a cell capacitor having a first buried contact connected with a semiconductor substrate of a cell region and a first storage node connected with the first buried contact, and a decoupling capacitor for reducing a coupling noise, having a plurality of second buried contacts formed on a semiconductor substrate portion adjacent in the cell region and extended in parallel with each other and a plurality of second storage nodes connected with the second buried contacts.

In another exemplary embodiment of the present invention, a semiconductor memory device comprises a cell capacitor having a first buried contact connected with a semiconductor substrate of a cell region and a first storage node connected with the first buried contact, and a decoupling capacitor for reducing a coupling noise, having a plurality of second buried contacts formed on a semiconductor substrate portion adjacent in the cell region and having convex portions and a plurality of second storage nodes connected with the convex portions of the second buried contacts.

In still another exemplary embodiment of the present invention, a semiconductor memory device having a cell capacitor in a cell region of a semiconductor substrate comprises a decoupling capacitor, having a plurality of buried contacts formed on a decoupling capacitor region of a semiconductor substrate portion and a plurality of storage nodes connected with the buried contacts.

These and other exemplary embodiments, aspects, features and advantages of the present invention will become apparent from the following detailed description of exemplary embodiments, which is to be read in connection with the accompanying drawings.

DETAILED DESCRIPTION OF THE INVENTION

Figure 1:
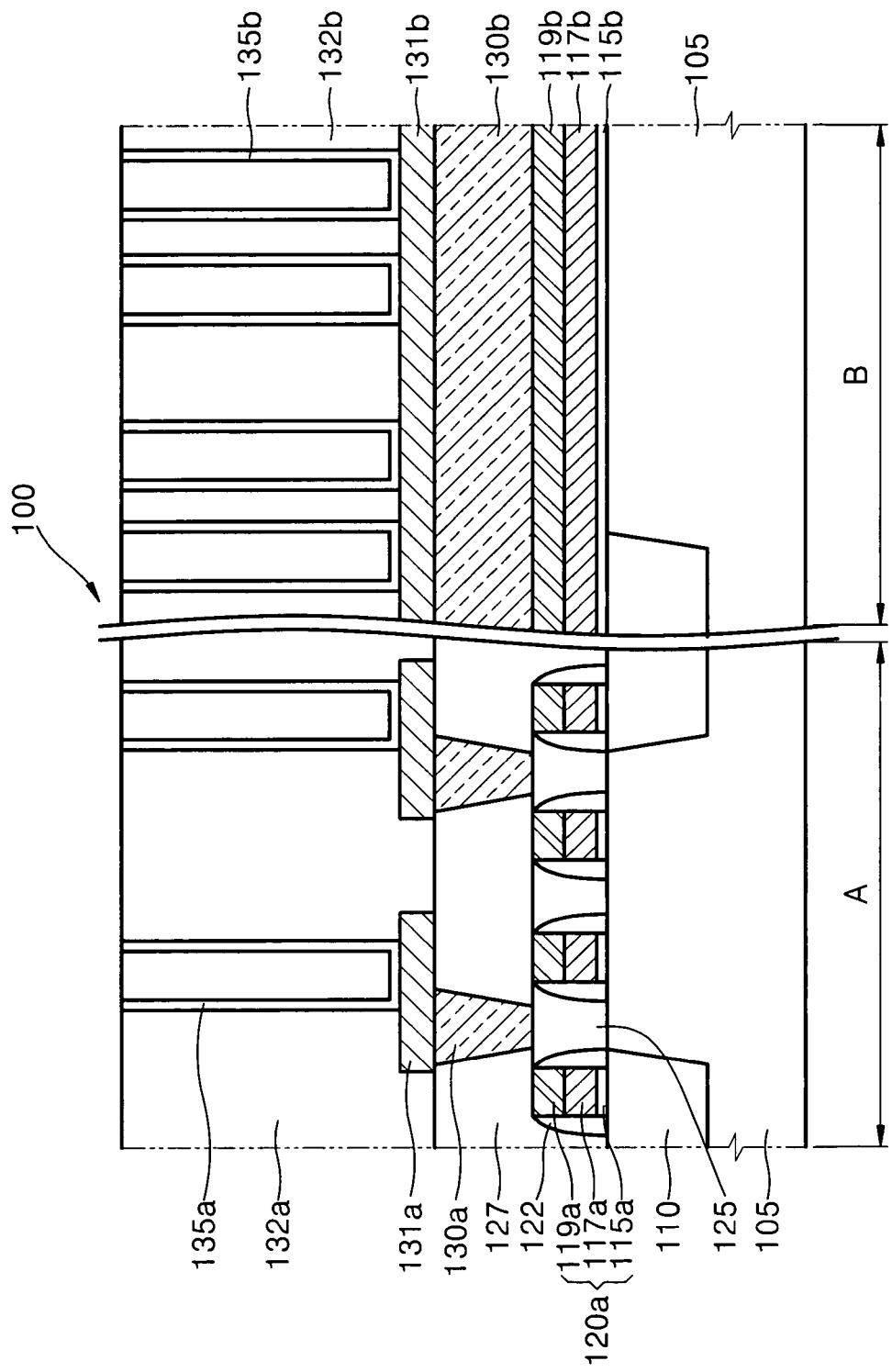
FIG. 1 is a cross-sectional view illustrating a semiconductor memory device of a conventional art.
Figure 2:
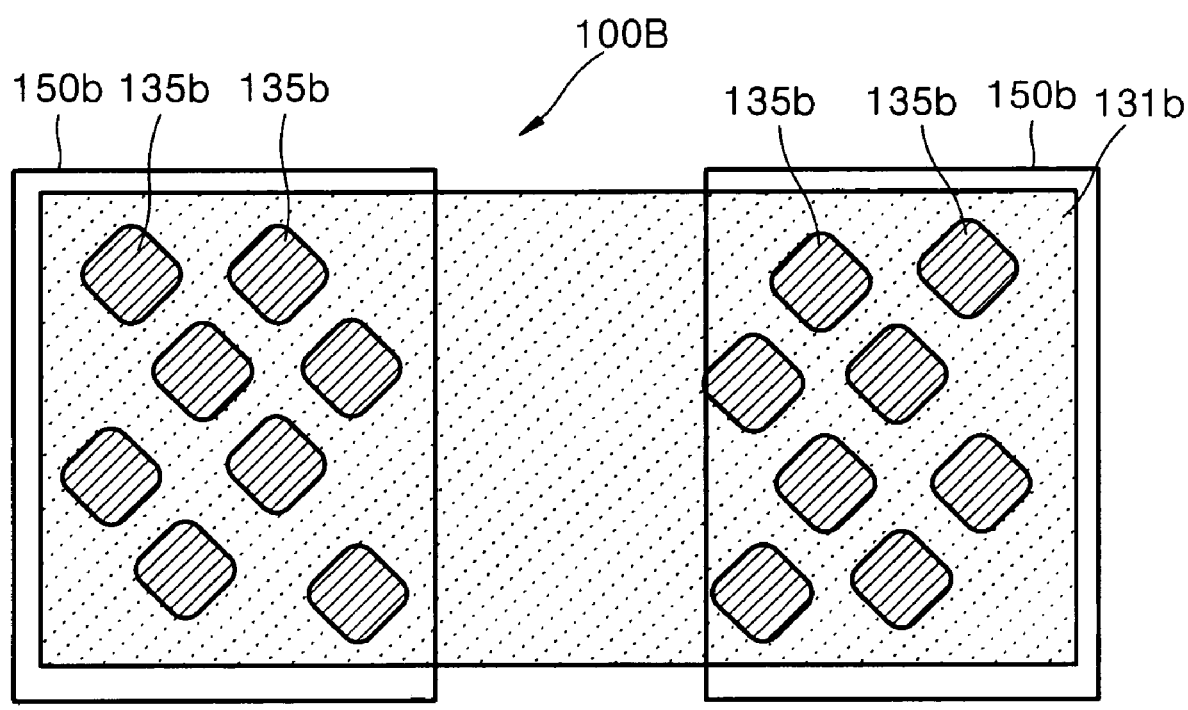
FIG. 2 is a plan view illustrating a decoupling capacitor of the semiconductor memory device according to the conventional art of FIG. 1.
Figure 3:
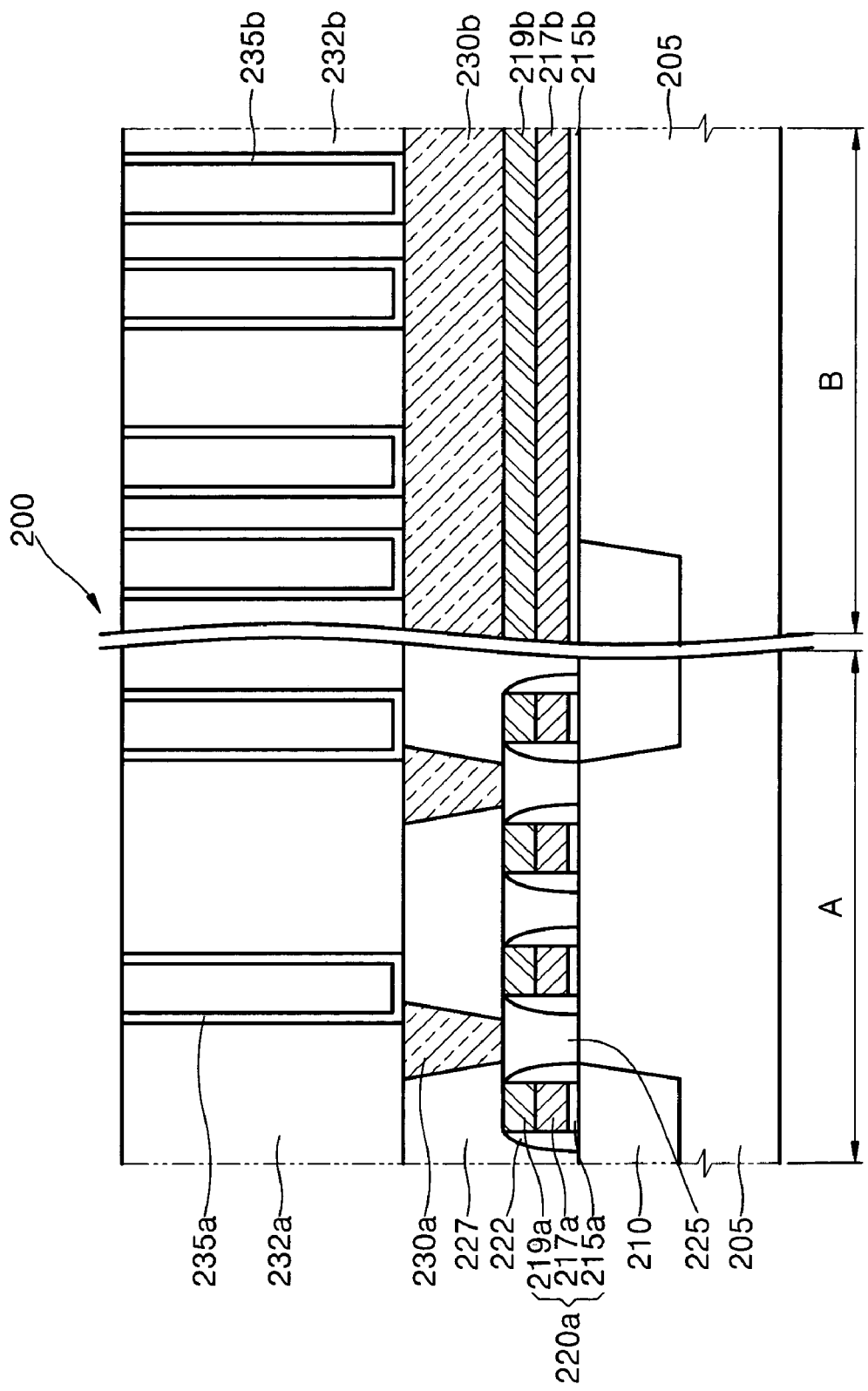
FIG. 3 is a cross-sectional view illustrating a semiconductor device according to an exemplary embodiment of the present invention.

Exemplary embodiments of the present invention will now be described more fully hereinafter below with reference to the accompanying drawings. This invention may, however, be embodied in different forms and should not be construed as limited to the exemplary embodiments set forth herein. Rather, these exemplary embodiments are provided so that this disclosure will be through and complete, and will fully convey the scope of the invention to those skilled in the art. FIG. 3 is a cross-sectional view illustrating a semiconductor device according to an exemplary embodiment of the present invention. Referring to FIG. 3, a semiconductor memory device 200 has a cell region A and a decoupling capacitor region B. A cell capacitor of the cell region A includes storage nodes 235a and a decoupling capacitor includes storage nodes 235b. The two storage nodes 235a and 235b may be simultaneously formed in the same structure.

The storage nodes 235a and 235b are connected with the respective buried contacts 230a and 230b. The storage nodes 235a and 235b are formed within mold oxide films 232a and 232b. The buried contacts 230a of the cell region A are formed within an inter-layer insulation film 227.

The buried contacts 230a of the cell region A are connected with a semiconductor substrate 205, more specifically, with a source/drain portion (not shown) confined by an element separation region 210 through cell pads 225. The cell pads 225 are formed in a self-alignment structure formed by word-line gates 220a and their lateral spacers 222. The word-line gates 220a include insulation films 215a, gate electrode films 217a, and capping films 219a.

The buried contacts 230b of the decoupling capacitor region B are formed on the capping film 219b. A gate insulation film 215b, a gate electrode film 217b, and a capping film 219b are sequentially formed on the semiconductor substrate 205.

Figure 4:
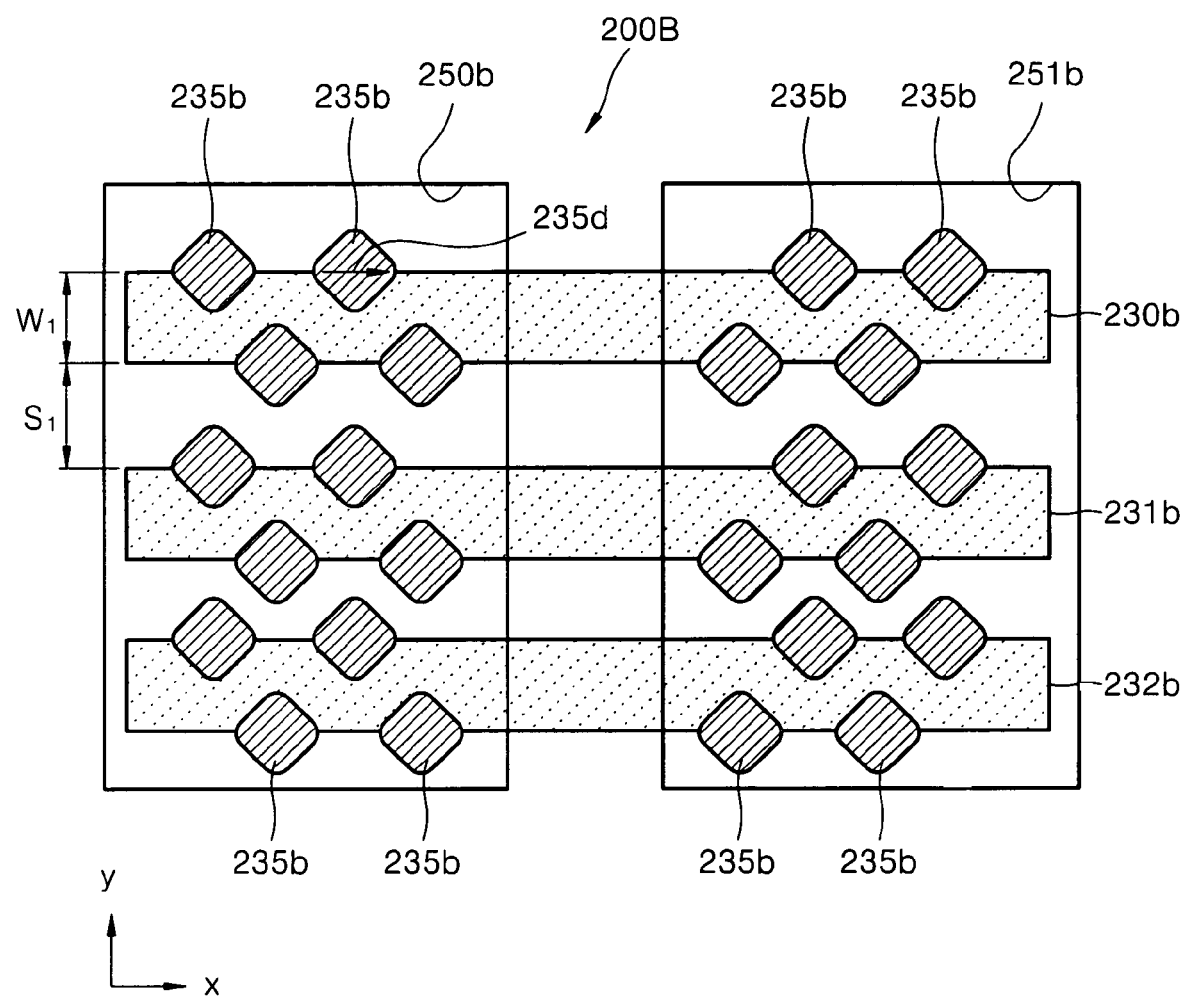
FIG. 4 is a plan view illustrating a decoupling capacitor of FIG. 3.

FIG. 4 is a plan view illustrating a decoupling capacitor of the semiconductor memory device 200 according to an exemplary embodiment of the present invention. Referring to FIG. 4, a decoupling capacitor 200B includes a plurality of storage nodes 235b formed on the buried contacts 230b, 231b and 232b. The buried contacts 230b, 231b and 232b are divided into two parts to form two plate electrodes 250b and 251b. The divided two plate electrodes 250b and 251b are formed on the storage nodes 235b.

The buried contacts 230b, 231b and 232b are in parallel with one another. The storage nodes 235b may be, for example, square-type nodes as illustrated in FIG. 4. The storage nodes 235b are arranged on both ends of the buried contacts 230b, 231b and 232b in an alternating manner along the extension direction (i.e., x-axis direction) of the buried contacts 230b, 231b and 232b to increase integration.

The storage nodes 235b may be arranged so that about more than half of them are formed on the buried contacts 230b, 231b and 232b. Thus, diagonals 235d of the storage nodes 235b can be arranged in parallel with the extension direction of the buried contacts 230b, 231b and 232b. A line width $W_1$ of the buried contacts 230b may be the same as a $S_1$ between the buried contacts 230b.

Figure 5:
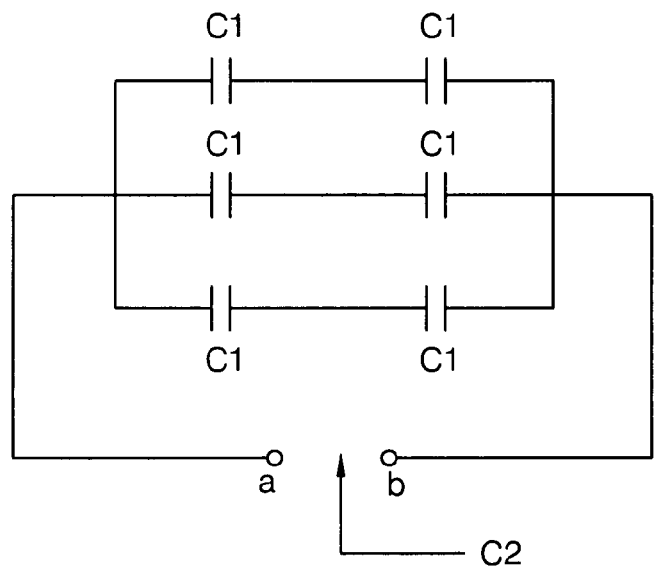
FIG. 5 is a schematic circuit diagram of the decoupling capacitor of FIG. 4.

FIG. 5 is a schematic circuit diagram of the decoupling capacitor 200B of FIG. 4 according to an exemplary embodiment of the present invention. Referring to FIG. 5, the decoupling capacitor 200B of FIG. 4 can be schematically illustrated as six equivalent capacitors C1 formed by the buried contacts 230b, 231 b and 232b and the plate electrodes 250b and 251b. One equivalent capacitor C1 has series-connected four storage nodes 235b. One buried contact 230b has series-connected two equivalent capacitors C1. Those skilled in the art will understand that the number of the storage nodes 235b and the number of the equivalent capacitors C1 are changeable. The buried contacts 230b, 231b and 232b are parallel-connected with each other. The parallel connection shown in FIG. 5 is an exemplary embodiment, and a circuit construction thereof can be modified in many different forms by those skilled in the art.

The decoupling capacitor 200B as seen from a or b terminal can be replaced by a larger equivalent capacitor C2 in which three buried contacts 230b are parallel-connected. In the conventional art, the decoupling capacitor is formed on the buffer layer. According to an exemplary embodiment of the present invention, forming a decoupling capacitor 200B having a large capacitance in a semiconductor device of high integration is capable by forming the storage nodes 235b such that the storage nodes 235b may be connected with the buried contacts 230b, 231b and 232b.

Figure 6:
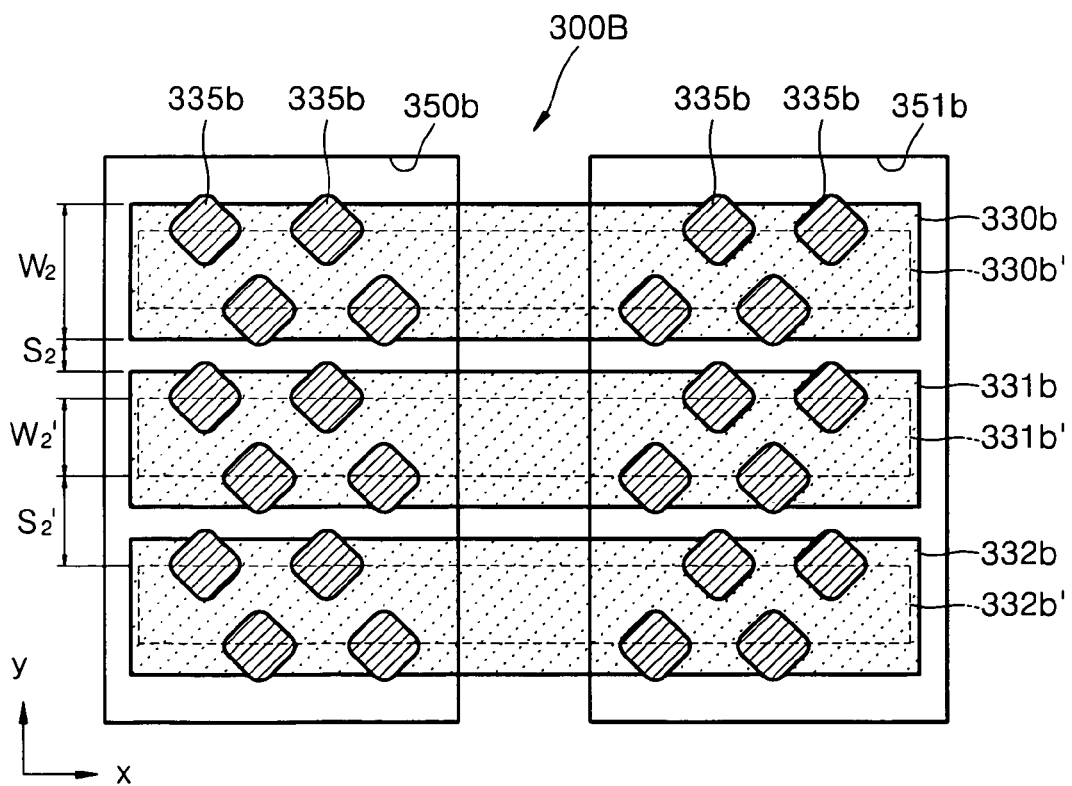
FIG. 6 is a plan view illustrating a decoupling capacitor according to another exemplary embodiment of the present invention.

FIG. 6 is a plan view illustrating a decoupling capacitor according to another exemplary embodiment of the present invention. FIG. 3 can be referred to for a cross-sectional structure of the semiconductor device. Referring to FIG. 6, a decoupling capacitor 300B has storage nodes 335b connected with the buried contacts 330b, 331b and 332b. The buried contacts 330b, 331b and 332b are in parallel with one another. The buried contacts 330b, 331b and 332 are divided into two parts to form two plate electrodes 350b and 351b. The two divided plate electrodes 350b and 351b are formed on the storage nodes 335b.

A line width $W_2$ of the buried contact 330b is greater than a distance $S_2$ between the buried contacts 330b, 331b and 332b. The distance S☐ between the buried contacts 330b, 331b and 332b may be in a range of about 20% to about 30% of the line width $W_2$. Preferably, the distance $S_2$ may be about 25% of the line width $W_2$. The storage nodes 335b may be, for example, square-type nodes and, can be formed in an alternating manner on both ends of the buried contacts 330b, 331b and 332b along an extension direction (i.e., x-axis direction) of the buried contacts 330b, 331b and 332b as shown in FIG. 6.

The buried contacts 330b can be formed by preliminary buried contacts 330b' illustrated by a dotted line on a mask design according to an exemplary embodiment of the present invention. A line width $W_{2'}$ of the preliminary buried contacts 330b' can be the same as a distance $S_{2'}$ between the preliminary buried contacts 330b', 331b' and 332b'. To increase a contact area between the storage nodes 335b and the buried contacts 330b', 331b' and 332b', the buried contacts 330b are formed larger than the mask design during a manufacturing process as illustrated in FIG. 6.

After the preliminary buried contacts 330b', 331b' and 332b' are formed, its neighboring parts, such as an oxide film, is wet-etched so that the preliminary buried contacts 330b', 331b' and 332b' expand. Alternatively, the buried contacts 330b, 331b and 332b, can be formed by filling a plug film. A tungsten film (W film) can be used for the plug film.

In an exemplary embodiment of the present invention, the contact area between the storage nodes 335b and the buried contacts 330b, 331b and 332b can expand and contact resistance can be lowered. Further, referring to FIG. 4, it is capable of obtaining a large equivalent capacitance and capable of lowering a coupling nose. The storage nodes 335b of the decoupling capacitor 300B can be simultaneously formed in the same structure as the storage nodes 235a of the cell capacitor as illustrated in FIG. 3.

Figure 7:
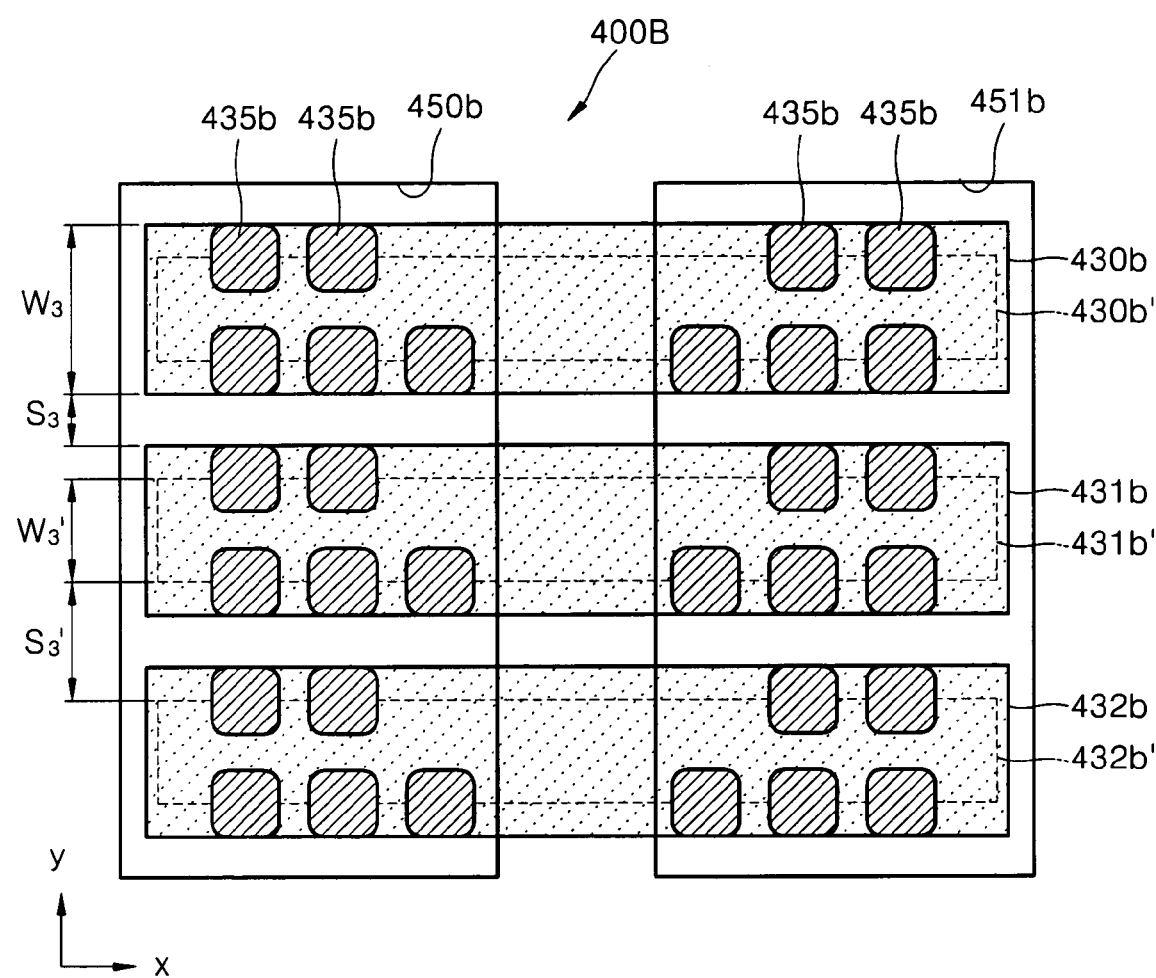
FIG. 7 is a plan view illustrating a decoupling capacitor of a semiconductor device according to another exemplary embodiment of the present invention.

FIG. 7 is a plan view illustrating a decoupling capacitor of a semiconductor device according to another exemplary embodiment of the present invention. FIG. 3 can be referred to a cross-sectional structure of the semiconductor device. Referring to FIG. 7, a decoupling capacitor 400B has storage nodes 435b connected with the buried contacts 430b, 431b and 432b. The buried contacts 430b, 431b and 432b are in parallel with one another. The buried contacts 430b, 431b and 432b are divided into two parts to form two plate electrodes 450b and 451b. The two divided plate electrodes 450b and 451b are formed on the storage nodes 435b.

The storage nodes 435b may be square-type storage nodes and, can be formed on both ends of the buried contacts 430b, 431b and 432b along an extension direction (i.e. x-axis direction) of the buried contacts 430b, 431b and 432b. A transverse or a longitudinal direction (i.e., x-axis direction) of the storage nodes 435b may be in parallel with the extension direction (i.e., x-axis direction) of the buried contacts 430b, 431b and 432b.

A line width $W_3$ of the buried contacts 430b, 431b and 432b is greater than a distance $S_3$ between the buried contacts 430b, 431b and 432b. The distance $S_3$ between the buried contacts 430b, 431b and 432b may be in a range of about 26% to about 40% of the line width $W_3$. Preferably, the distance $S_3$ is about ⅓ of the line width $W_3$.

A ratio of the distance $S_3$ to the line width $W_3$ of the buried contacts 430b, 431b and 432b can be greater than that of the distance $S_2$ to the line width $W_2$ of the buried contacts 330b, 331b and 332b in FIG. 6 when the transverse and the longitudinal directions (i.e., x-axis direction) of the storage nodes 435b in FIG. 7 are in parallel with the extension direction (i.e., x-axis direction) of the buried contacts 430b, 431b and 432b.

The buried contacts 430b, 431 b and 432b can be formed by preliminary buried contacts 430b', 431b' and 432b' illustrated by a dotted line on a mask design. A line width $W_3$ of the preliminary buried contacts 430b', 431b' and 432b' can be the same as a distance $S_{3'}$ between the preliminary buried contacts 430b', 431b' and 432b'. The line width $W_{3'}$ of the preliminary buried contacts 430b', 431b' and 432b' is about 50% greater than the line width $W_{2'}$ of the preliminary buried contacts 330b', 331b' and 332b' illustrated in FIG. 6.

As described with reference to FIG. 6, after the preliminary buried contacts 430b', 431b' and 432b' are formed, its neighboring parts are wet-etched so that the preliminary buried contacts 430b', 431b' and 432b' expand to form the buried contacts 430b, 431b and 432b. Thus, contact areas between the buried contacts 430b, 431b and 432b and the storage nodes 435b can expand. Further, since the distance $S_3$ between the buried contacts 430b, 431b and 432b can be greater than that of FIG. 6, it is capable of effectively preventing mask patterns from being deformed in a process of expanding the preliminary buried contacts 430b', 431b' and 432b'.

Figure 8:
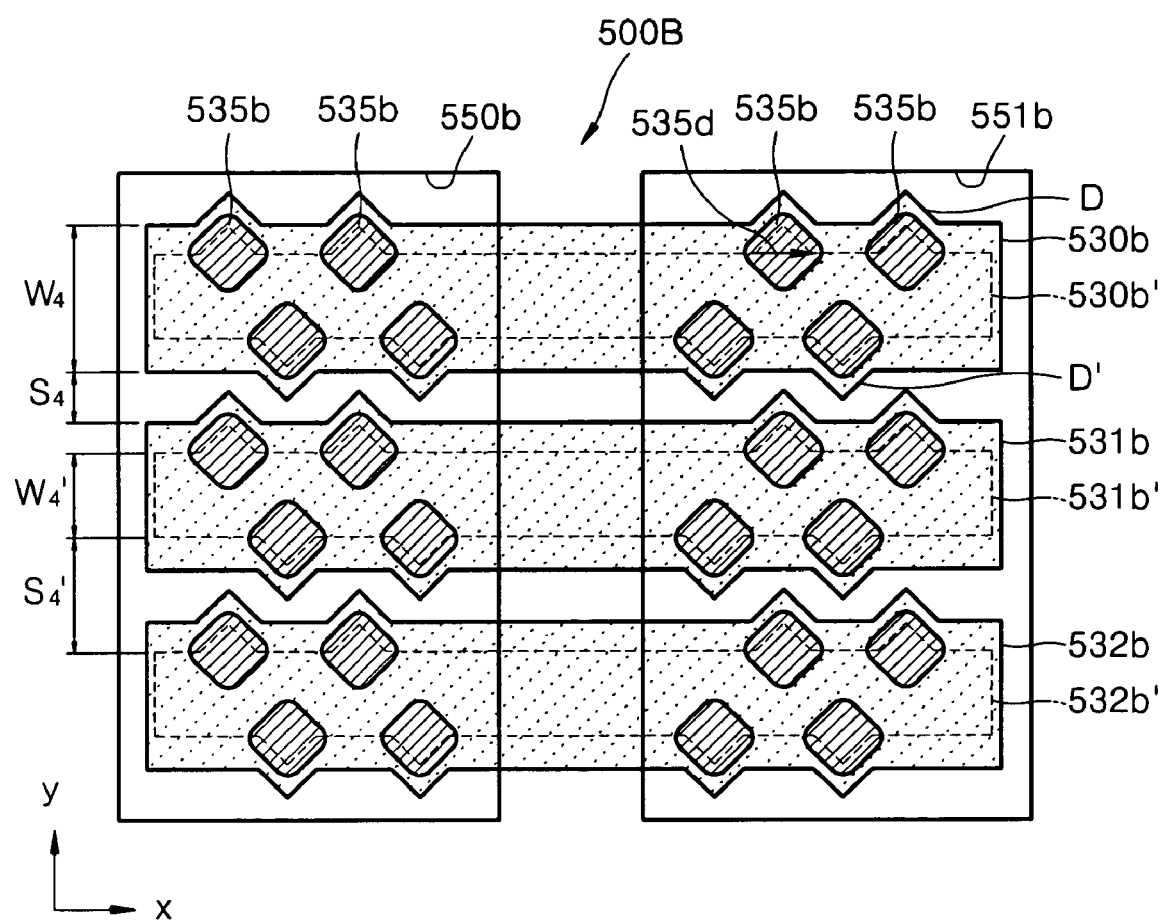
FIG. 8 is a plan view illustrating a decoupling capacitor of a semiconductor device according to still another exemplary embodiment of the present invention.

FIG. 8 is a plan view illustrating a decoupling capacitor of a semiconductor device according to still another exemplary embodiment of the present invention. FIG. 3 can be referred to for a cross-sectional structure of the semiconductor device. A decoupling capacitor 500B has storage nodes 535b connected with convex portions D of buried contacts 530b, 531b and 532b. The buried contacts 530b, 531b and 532b are divided into two parts to form two plate electrodes 550b and 551b. The two divided plate electrodes 550b and 551b are formed on the storage nodes 535b.

The buried contacts 530b, 531 b and 532b may be of a straight-line type buried contact such that the convex portions D are formed in an alternating manner (i.e., D and D') in the width direction (i.e., y-axis direction) as shown in FIG. 8. When the buried contact 531b has a convex portion (D) in its end on the width direction (i.e., y-axis direction), another buried contact 530b does not have a convex portion in its corresponding end on the width direction. Thus, referring to FIG. 8, when seen from the longitudinal direction, the convex portions are formed in an alternating manner both within one buried contact 530b and between the adjacent buried contacts 530b, 531b and 532b.

Referring to FIG. 8, the storage nodes 535b are formed to be connected with the convex portions (D and D') of the buried contacts 530b, 531 b and 532b.

Most of the storage nodes 535b are formed on the buried contacts 530b, 531b and 532b. The storage nodes 535b may be square-type nodes and their diagonal directions (535d) may be in parallel with an extension direction (i.e., x-axis direction) of the buried contacts 530b, 531b and 532b. A line width $W_4$ of the buried contacts 530b, 531b and 532b is greater than a distance $S_4$ between the buried contacts 530b, 531b and 532b. The distance $S_4$ between the buried contacts 530b, 531b and 532b may be in a range of about 21% to about 31% of the line width $W_4$.

The buried contacts 530b can be formed by preliminary buried contacts 530b', 531b' and 532b' illustrated by a dotted line on a mask design. A line width $W_4'$ of the preliminary buried contacts 530b', 531b' and 532b' can be made smaller than a distance $S_4'$ between the preliminary buried contacts 530b', 531b' and 532b'. A ratio of the distance $S_4'$ to the line width $W_4'$ of the preliminary buried contacts 530b', 531b' and 532b' may be about 1.4 to about 2.0 and, preferably, ⅗. The line width $W_4'$ of the preliminary buried contacts 530b', 531b' and 532b' can be about ¾ of the line width $W_2$' of the preliminary buried contacts 330b', 331b' and 332b' illustrated in FIG. 6.

As described with reference to FIG. 6, after the preliminary buried contacts 530b', 531b' and 532b' are formed, its neighboring portions are wet-etched so that the preliminary buried contacts 530b', 531b' and 532b' are expanded, whereby the buried contacts 530b, 531b and 532b can be finally formed. Thus, contact areas between the buried contacts 530b, 531b and 532b and the storage nodes 535b can be more expanded.

Although the distance $S_4$ between the buried contacts 530b, 531b and 532b is smaller than that of FIG. 6, the buried contacts 530b, 531b and 532b are formed to have the convex portions (D and D'). Deformation of the mask pattern can be prevented when the preliminary buried contacts 530b' are expanded.

Therefore, it is possible to form a decoupling capacitor 500B having a large capacitance capable of reducing a coupling noise in semiconductor devices of high integration by forming the buried contacts 530b, 531 b and 532b having the convex portions (D and D').

Although exemplary embodiments have been described herein with reference to the accompanying drawings, it is to be understood that the present invention is not limited to such exemplary embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor memory device comprising:
a cell capacitor having a first buried contact connected with a semiconductor substrate of a cell region and a first storage node connected with the first buried contact; and
a decoupling capacitor, having a plurality of second buried contacts formed on a semiconductor substrate portion adjacent to the cell region and extended in parallel with each other and a plurality of second storage nodes connected with the second buried contacts,
wherein each of the second storage nodes is formed in a square shape and a diagonal of each of the second storage nodes is in parallel with an extension direction of the second buried contacts.

2. The semiconductor memory device of claim 1, wherein more than half of the second storage nodes are formed on the second buried contacts.

3. The semiconductor memory device of claim 2, wherein the second buried contacts have a line width which is larger than a distance between the second buried contacts.

4. The semiconductor memory device of claim 3, wherein the distance is in a range of about 20% to about 30% of the line width.

5. The semiconductor memory device of claim 1, wherein the second storage nodes are formed in an alternating manner on both ends of the second buried contacts along the extension direction of the second buried contacts.

6. A semiconductor memory device comprising:
a cell capacitor having a first buried contact connected with a semiconductor substrate of a cell region and a first storage node connected with the first buried contact; and
a decoupling capacitor, having a plurality of second buried contacts formed on a semiconductor substrate portion adjacent to the cell region and having convex portions and a plurality of second storage nodes connected with the convex portions of the second buried contacts.

7. The semiconductor memory device of claim 6, wherein the second buried contacts are of a straight-line type such that if a convex portion exists at one end in a width direction of the second buried contacts, a convex portion does not exist at the other end in the width direction of the buried contacts.

8. The semiconductor memory device of claim 7, wherein the second buried contacts are of a straight-line type such that if one buried contact of the second buried contacts has a convex portion in its end in the width direction, another buried contact of the second buried contacts adjacent to the one buried contact of the second buried contact does not have a convex portion in its corresponding end in the width direction.

9. The semiconductor memory device of claim 6, wherein the first storage node and the storage nodes are square-type nodes.

10. The semiconductor memory device of claim 9, wherein the second buried contacts have a line width which is larger than a distance between each of the second buried contacts.

11. The semiconductor memory device of claim 10, wherein the distance is in a range of about 21% to about 31% of the line width.

12. The semiconductor memory device of claim 10, wherein the convex portions are formed in an alternating manner on both ends of a width direction in the second buried contacts.

13. The semiconductor memory device of claim 10, wherein a diagonal direction of the second storage nodes is in parallel with an extension direction of the second buried contacts.

14. A semiconductor memory device having a cell capacitor in a cell region of a semiconductor substrate, the semiconductor memory device comprising:
a decoupling capacitor, having a plurality of buried contacts formed on a semiconductor substrate portion and a plurality of storage nodes connected with the buried contacts, wherein the decoupling region is adjacent to the cell regions,
wherein each of the storage nodes is formed in a square shape and a diagonal of each of the storage nodes is in parallel with an extension direction of the buried contacts.

15. The semiconductor memory device of claim 14, wherein the buried contacts have convex portions in its width direction and the storage nodes are connected with the convex portions.

* * * * *